Oct. 12, 1965 MOTOMU TADAMA 3,212,022

MEANS FOR SUPPRESSING PARASITIC OSCILLATIONS IN TUNNEL DIODE CIRCUIT

Filed April 25, 1961

Inventor
Motomu Tadama by Hill, Sherman, Meroni, Gross & Simpson Attys.

United States Patent Office 3,212,022

Patented Oct. 12, 1965

3,212,022

MEANS FOR SUPPRESSING PARASITIC OSCILLATIONS IN TUNNEL DIODE CIRCUIT

Motomu Tadama, Tokyo, Japan, assignor to Sony Corporation, Tokyo, Japan, a corporation of Japan Filed Apr. 25, 1961, Ser. No. 105,473
Claims priority, application Japan, Apr. 27, 1960, 35/22,733
5 Claims. (Cl. 330—61)

This invention relates to tunnel diode circuits and particularly to circuits which include means for suppressing parasitic oscillations. The invention is particularly applicable to amplifiers, oscillators, frequency converters, amplitude limiters and the like which employ a tunnel diode (commonly referred to as the Esaki diode).

It is an object of this invention to provide a new and improved circuit using a tunnel diode which is stable in operation.

Another object of this invention is to provide an improved circuit using a tunnel diode wherein means are provided to block or stop undesirable parasitic oscillations which are otherwise apt to occur from the use of such a tunnel diode.

Other objects, features and advantages of this invention will become fully apparent from the following description taken in connection with the accompanying drawings, in which FIGURE 1 is a characteristic curve of a tunnel diode employed in this invention;

Figure 1:
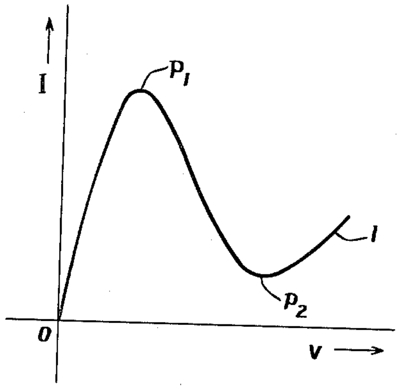
Fig. 1 PRIOR ART
Figure 2:
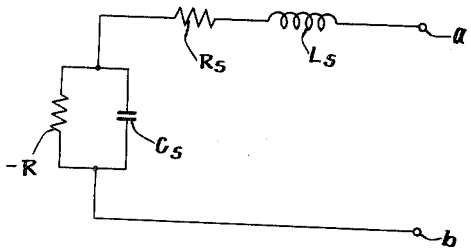
Fig. 2 PRIOR ART
FIGURE 2 is the equivalent circuit of a tunnel diode.

A tunnel diode is a semiconductor diode which inherently possesses a distinctive negative resistance characteristic over a range of forwardly applied voltages as exemplified by curve 1 of FIGURE 1. The negative resistance portion of the curve lies between the maximum point $P_1$ and the minimum point $P_2$ for over this range the current decreases as the voltage increases. Advantage is taken of this negative resistance characteristic for when biased into the negative resistance region (or into the positive resistance region in the vicinity of the maximum point $P_1$) such a tunnel diode can be utilized for an amplifier, oscillator, amplitude limiter, frequency converter or the like. Because of the high effective transit time of a charge carrier from one side of the diode junction to the other (sometimes referred to as resulting from quantum mechanical tunnelling), the tunnel diode is particularly useful as a high frequency device. One disadvantage, however, has been noted particularly when used in very high frequency circuits and that is the fact that parasitic oscillations frequently occur. It will be recalled that a tunnel diode has its own barrier (transition region) capacity, $C_s$ and its own diffusion resistance, $R_s$. The electrodes of the tunnel diode and the lead wires to be referred to as $L_s$. The tunnel diode also has a pure negative resistance $-R$. Accordingly, an equivalent circuit may be drawn for the tunnel diode, as shown in FIGURE 2. From an inspection of this equivalent circuit, it will be apparent that any circuit using the tunnel diode will have a parasitic oscillation of relatively high frequency as determined by the inductance $L_s$ and the barrier (transition region) capacity $C_s$. Such a parasitic oscillation will adversely affect any circuit using the tunnel diode. Hence, this will prevent the construction of a truly stable amplifier, oscillator, frequency converter and other related device.

Before considering the novel means of the present invention, certain characteristics of tunnel diode circuits in general should be noted. The tunnel diode has two main categories of D.-C. operation depending upon the total series resistance in the circuit. If the D.-C. series resistance $R_s$ is greater than the negative resistance $|-R|$ the tunnel diode will operate as a bistable or monostable switch. If the D.-C. series resistance $R_s$ is less than $|-R|$ and the bias voltage selected so as to place the operating point in the negative resistance region the tunnel diode will operate either as an oscillator or an amplifier. To have the diode operate as an oscillator in addition to the above requirement the total A.-C. series resistance must be negative. Amplifier operation results when the total A.-C. parallel resistance is positive. A more complete description of the biasing methods for tunnel diodes and illustrative applications is given in the article by Ray P. Murray entitled "Biasing Methods for Tunnel Diodes" in the magazine Electronics 82 (June 3, 1960).

As the frequency of operation of the tunnel diode increases, the reactances of the diode reduce its negative resistance until the net resistance changes from negative to positive. This negative resistance cutoff frequency, $f_L$, defines the upper useful frequency of the tunnel diode.

The oscillation frequency $f_L$ using a tunnel diode is generally given by the following formula:

$$f_L=\frac{1}{2\pi C_s}\sqrt{\frac{1-\frac{R_s}{R_L}}{R_L R_s}}$$

where $R_L$=is the least numerical absolute value of the diode negative resistance
$R_s$=diffusion resistance of tunnel diode
$C_s$=barrier capacity of tunnel diode It will also be noted that if the terminals $a$ and $b$ were short-circuited, the resonant frequency, $f_0$, of the tunnel diode itself and its associated inductance would be expressed by the formula:

$$f_0=\frac{1}{2\pi\sqrt{L_s C_s}}$$

where $L_s$=associated inductance of lead wires to tunnel diode
$C_s$=barrier capacity of tunnel diode Since this is so, an oscillation of substantially the frequency $f_0$ will be caused when the frequency $f_L$ is greater than the tunnel diode resonant frequency $f_0$ even if the terminals $a$ and $b$ are short-circuited.

If a circuit such, for example, as an oscillator or an amplifier is formed with the tunnel diode TD as a part thereof and if its operating frequency $f$ is substantially lower than the tunnel diode resonant frequency $f_0$, the electrical circuit will be almost short circuited and parasitic oscillation will occur with a frequency near the frequency $f_0$.

It is a principal feature of the present invention to eliminate or substantially reduce this parasitic oscillation.

Figure 3:
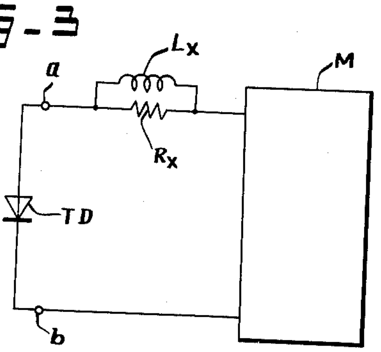
FIGURE 3 is a circuit diagram illustrating the addition of means to a tunnel diode circuit to substantially eliminate parasitic oscillations.

The circuit diagram of FIGURE 3 diagrammatically illustrates an embodiment of the present invention. As there shown, the tunnel diode TD is associated with a circuit represented by the block M. It is to be understood that block M represents the balance of any circuit which in conjunction with the tunnel diode TD acts as an amplifier, oscillator, amplitude limiter, frequency converter or the like. Now into this circuit is inserted an inductance element $L_x$ and a resistance element $R_x$, these two elements being in parallel with each other but as a unit are in series with the tunnel diode TD. The inductance of the element $L_x$ is so selected that its impedance may be neglected with respect to the operating frequency $f$ of the objective electric circuit M, but with a value of the impedance which is large as compared with the equivalent inductance $L_s$.

The resonant frequency of the circuit shown in FIG. 3 with the above electrical element $L_x$ and $R_x$ is represented by the following formula:

$$f_{01}=\frac{1}{2\pi\sqrt{(L_s+L_x)C_s}}$$

It will be noted that the frequency $f_{01}$ is lower than the frequency of $f_0$ but higher than the operating frequency appreciately.

Thus, by adding the inductance-resistance unit above referred to the circuit M may be operated at its selected relatively high frequency $f$ without being materially affected and substantially attenuated by the added inductance $L_x$ and resistance $R_x$. To state this in a somewhat different manner the addition of the inductance $L_x$ lowers the resonant frequency of the tunnel diode circuit producing the parasitic oscillation from $f_0$ to $f_{01}$ and the resistance $R_x$ can then effectively stop them. The net effect is that the circuit M may now be operated in a stable manner.

The value of $R_x$ is so chosen to have a valve which lowers the Q of the parasitic tank circuit so that the parasitic oscillation frequency is eliminated. Generally the value of $R_x$ is selected at the range from one tenth to ten times the absolute negative resistance value of the tunnel diode TD, preferably at the same value of the diode.

Figure 4:
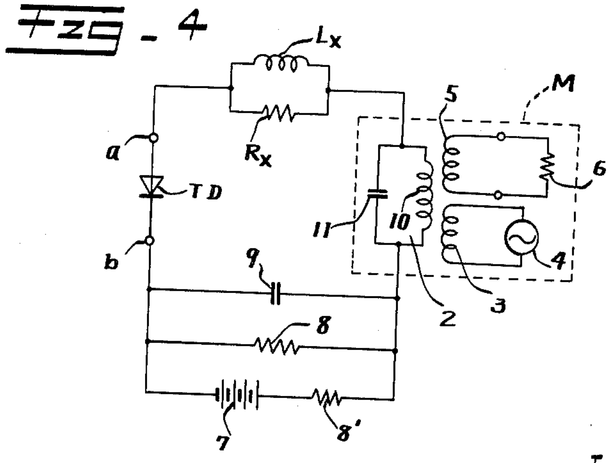
FIGURE 4 is a circuit diagram illustrating a specific embodiment of this invention.

Having now made reference to the general principles of my invention, reference will now be made to a specific application. In FIGURE 4 of the drawing there is shown an embodiment of the invention in a tunnel diode amplifier. Specifically, a tunnel diode TD is connected to a tuned circuit 2 to which a signal to be amplified supplied from the source 4 is fed through coil 3. The tuned circuit 2 includes an inductance element 10 and a condenser 11. Inductance elements 3 and 10 may conveniently be the primary and secondary respectively of a transformer. The amplified signal is taken from the coil 10 by the inductively coupled output coil 5 and delivered to a load as represented by the resistance 6. The tunnel diode of course requires a source of D.C. bias and such is represented here by the battery 7. The usual by-pass or bias resistors 8 and 8′ are provided across the battery 7 and a by-pass condenser 9 to keep the A.-C. out of the battery is also provided across the battery 7. Into the tunnel diode circuit is inserted an inductance element $L_x$ and a resistance element $R_x$ in the manner and for the reasons previously described in connection with FIGURE 3. Specifically, the element $L_x$ is selected to have an inductance sufficiently low as not to affect the operating frequency of the signal source 4 and the resistor $R_x$ is selected to have a value to stop parasitic oscillation by the tunnel diode itself.

For example, a germanium tunnel diode is employed, and the diode each constant is measured as follows:

| | | |
|---|---|---|
| $-R$ | ohms | 75 |
| $C_s$ | micromicro farads | 6 |
| $R_s$ | ohms | 2.5 |
| $L_s$ | millimicrohenries | 1 |
| $f_L$ | megacycles | 4600 |

A numerical example of the circuit shown in FIG. 4, the inductance of element $L_x$ was selected the value of 10 milli-micro henries, and the tuned circuit 2 was operated with the frequency of 100 megacycles. In this case, the resistance of the element $R_x$ was chosen the value of 75 ohms.

It will be apparent that many modifications and variations may be effected without departing from the scope of the novel concepts of this invention.

I claim as my invention:

1. An electrical circuit comprising a tunnel diode having a negative resistance characteristic, said diode having a cut-off frequency greater in magnitude than the resonant frequency thereof, an operating circuit connected to said tunnel diode, an inductive element having a negligibly small inductive property with respect to an application frequency of said operating circuit, and a resistor having a resistive value to stop parasitic oscillations of a frequency determined by the equivalent circuit impedance of said tunnel diode itself and said inductive element, said inductive element and said resistor being connected in parallel to each other and being connected in series with said tunnel diode.

2. An amplifier comprising a tunnel diode having a negative resistance characteristic, said diode having a cut-off frequency greater in magnitude than the resonant frequency thereof, a tuned circuit, an inductance element having a negligibly small inductive property with respect to the frequency to be amplified, a resistor for suppressing parasitic oscillations, the frequency of which is determined by the equivalent circuit impedance of said tunnel diode itself and said inductive element, said inductive element and said resistor being connected in parallel to each other and being connected in series with said tunnel diode and said tuned circuit, a bias current source for biasing said tunnel diode, a signal source delivering a signal to be amplified, coupling means connected to said signal source and coupled with said tuned circuit, a second coupling means coupled with said tuned circuit for obtaining an amplified signal, and a load connected to said second coupling means.

3. An electric circuit having fluctuating electric current therein of relatively high predetermined frequency, said circuit including a tunnel diode and an inductance element connected in series, said diode having a cut-off frequency greater in magnitude than the resonant frequency thereof, a resistor connected in parallel across said inductance element, said inductance element having relatively low impedance at said predetermined frequency and said resistor having a resistive value to suppress parasitic oscillations produced by the tunnel diode itself in conjunction with said inductance element.

4. An electric circuit having fluctuating electric current therein of relatively high predetermined frequency, said circuit including a tunnel diode and an inductance element connected in series, said diode having a cut-off frequency greater in magnitude than the resonant frequency thereof, a resistor connected in parallel across said inductance element, said inductance element having relatively low impedance at said predetermined frequency and said resistor having a resistive value at the range from one tenth to ten times of the absolute negative resistance value of said tunnel diode to suppress parasitic oscillations produced by said tunnel diode itself in conjunction with said inductance element.

5. A high frequency electric circuit having a tunnel diode therein having a cut-off frequency greater in magnitude than the resonant frequency thereof, means for feeding a high frequency signal to said circuit, an output coupled to said high frequency circuit for receiving the operating frequency of said circuit, a parasitic suppressor connected in series with said tunnel diode in said high frequency circuit, said suppressor including means for passing said operating frequency therethrough without any substantial attenuation and said suppressor including means for lowering the Q of a resonant circuit which includes the impedance of said tunnel diode and said means for passing said operating frequency, to a point below the point where parasitic oscillations occur.

References Cited by the Examiner

UNITED STATES PATENTS

| | | | |
|---|---|---|---|
| 2,978,576 | 4/61 | Watters | 307—88.5 |
| 3,116,459 | 12/63 | Tiemann | 330—24 |

OTHER REFERENCES

Roddam: Negative Resistance, Wireless World, July 1954, pages 335–338.

Change Article, Pro. IRE, July 1959, pages 1268 and 1269.

ELI J. SAX, NATHAN KAUFMAN, *Examiners.*

ROY LAKE, *Primary Examiner.*